United States Patent [19]

Ito et al.

[11] Patent Number: 5,170,135
[45] Date of Patent: Dec. 8, 1992

[54] PHASE AND FREQUENCY-LOCKED LOOP CIRCUIT HAVING EXPANDED PULL-IN RANGE AND REDUCED LOCK-IN TIME

[75] Inventors: Tomokazu Ito; Hiroshi Takeuchi, both of Tokyo; Hironao Suzuki, Miyagi, all of Japan

[73] Assignee: NEC Corporation, Japan

[21] Appl. No.: 735,292

[22] Filed: Jul. 24, 1991

[30] Foreign Application Priority Data

Jul. 24, 1990 [JP] Japan .................. 2-195570
Aug. 8, 1990 [JP] Japan .................. 2-209854

[51] Int. Cl.⁵ .................................. H03L 7/10
[52] U.S. Cl. .................. 331/1 A; 331/12; 331/14; 331/17; 331/25; 331/27
[58] Field of Search .............. 331/1 A, 11, 12, 14, 331/17, 25, 27

[56] References Cited

U.S. PATENT DOCUMENTS 4,862,104 8/1989 Muratani et al. .................. 331/17 X Primary Examiner—Siegfried H. Grimm
Attorney, Agent, or Firm—Ostrolenk, Faber, Gerb & Soffen

[57] ABSTRACT

A phase/frequency-locked loop (P/FLL) circuit for generating output signals synchronized with input signals in frequency and phase. The circuit includes a phase comparator which responds to the input signals and to the output signals to develop therefrom phase comparison signals in the form of positive or negative voltages corresponding to the phase differences between the input and output signals. A filtering circuit produces from the phase comparison signals a control signal for a voltage controlled oscillator (VCO) which produces in turn an oscillation signal having a frequency corresponding to the control signal. A phase controller responds to the control signal for the VCO as well as to the output oscillation signal thereof and produces the output signals in a form and wave shape which cause the control signal for the VCO to have a single voltage polarity. The P/FLL circuit of the invention reduces the time required to pull-in the frequency of the VCO and also expands the pull-in range.

16 Claims, 8 Drawing Sheets

INPUT SIGNAL

OUTPUT SIGNAL

PHASE COMPARATOR 1 OUTPUT

OUTPUT 1ST & 2ND LPF 4 & 5

COMPARATOR 62 OUTPUT

1ST F.F. 61

AND GATE 63 OUTPUT

2ND F.F. OUTPUT

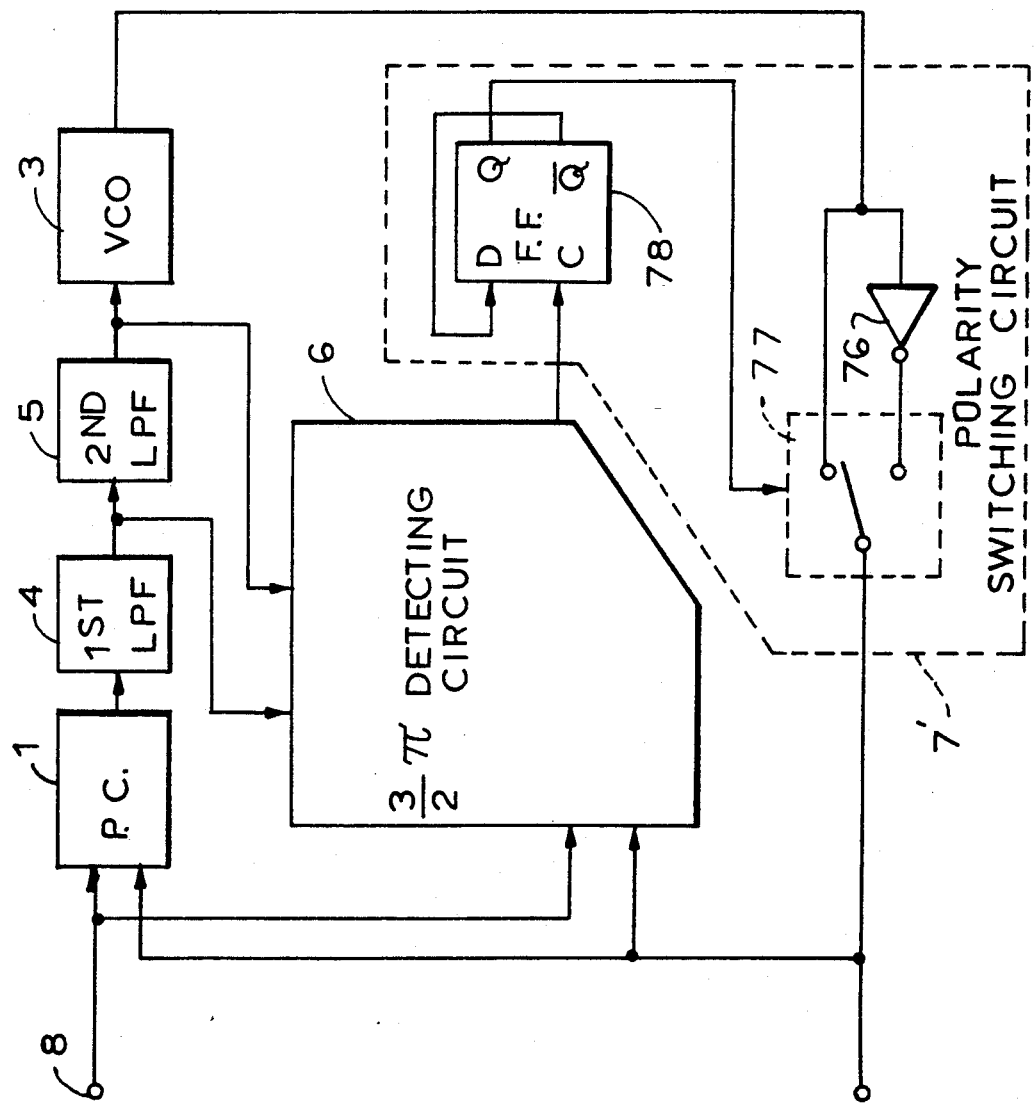

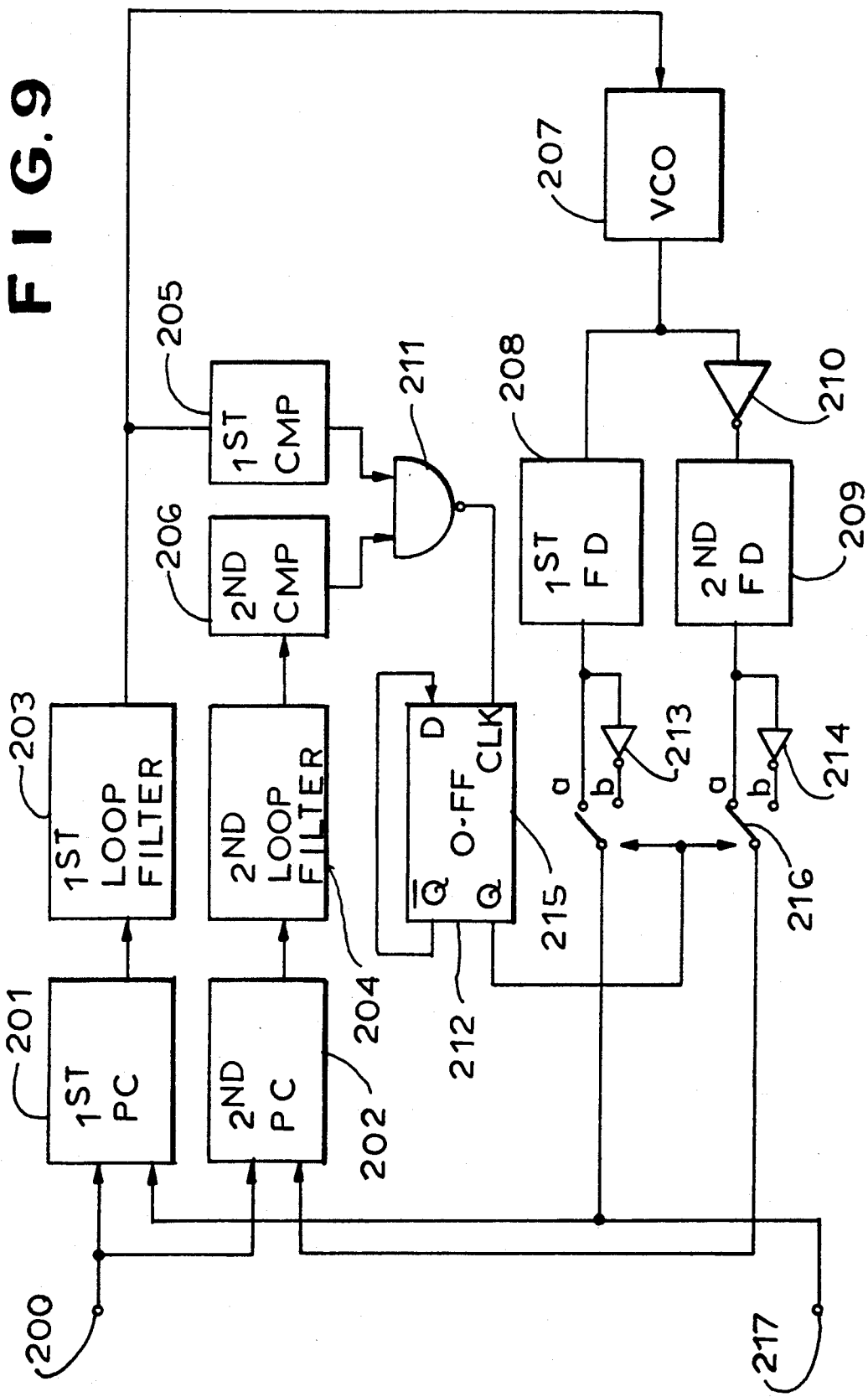

PHASE AND FREQUENCY-LOCKED LOOP CIRCUIT HAVING EXPANDED PULL-IN RANGE AND REDUCED LOCK-IN TIME

BACKGROUND OF THE INVENTION

The present invention relates to a phase and frequency-locked loop (P/FLL) circuit, and more particularly to the expansion of the pull-in range of the frequency and the reduction of the synchronization time thereof.

A P/FLL circuit, intended for feedback-control of a voltage controlled oscillator (VCO) to cause the same to output signals synchronized with input signals in phase and frequency, has a configuration in which a phase comparator, a loop filter and the VCO are connected in a loop form. The phase comparator, receiving input signals and the output signals of the VCO (the output of the P/FLL circuit), generate voltages corresponding to the phase differences as phase difference signals. The loop filter removes the high frequency noise component from the phase difference signals to output a frequency control signal, and also determines the response characteristics and the synchronization characteristics of the P/FLL circuit according to its amplitude and phase characteristics. The VCO oscillates at a frequency in accordance with the frequency control signal, with a predetermined oscillation frequency range. The oscillation output of the VCO is fed back to the phase comparator, and is also supplied as the output signal of the P/FLL circuit.

In such a P/FLL circuit, the process in which an output signal synchronized with an input signal is obtained can be divided into a frequency pull-in process and a phase lock-in process following it. Usually, an input signal and the output signal of a VCO in a free-running system are not identical either in frequency or in phase. Therefore, after their frequencies are brought close to each other, they are synchronized in the lock-in process. Since a cycle slip (rotation of the phase difference) is repeated in the pull-in process, the output of the phase comparator takes on a beat waveform. The D.C. component of this beat signal is used as the control signal of the VCO. If the frequency of the beat signal is not higher than a frequency determined by the loop characteristic of the P/FLL circuit, synchronization with the input signal will be possible. In the pull-in process, the positive half-cycle acts to bring the oscillation frequency of the VCO closer to, and the negative half-cycle, to bring it away from, the frequency of the input signal. As a result, in the beat waveform, the positive half-cycle gradually becomes longer than the negative half-cycle and, as the D.C. component increases, the oscillation frequency of the VCO comes closer to the frequency of the input signal. In such a P/FLL circuit by the prior art, there is the problem that the pull-in process takes a long time.

SUMMARY OF THE INVENTION

An object of the present invention is to provide a P/FLL circuit in which the time required for the pull-in process is reduced.

Another object of the invention is to provide a P/FLL circuit whose pull-in range is expanded.

A phase/frequency-locked loop (P/FLL) circuit for generating output signals synchronized with input signals in frequency and phase, comprises a phase comparator which receives the input signals and the output signals, and outputs positive or negative voltages corresponding to the phase difference between them as phase comparison signals. A first integrating circuit calculates the integrated value of the phase comparison signals in each first prescribed time and outputs it as a first integrated signal. A second integrating circuit calculates the integrated value of the phase comparison signals in each second prescribed time and outputs it as a second integrated signal. A voltage controlled oscillator receives the second integrated signal, and outputs an oscillation signal having a frequency corresponding to the second integrated signal. A phase controller which has a comparator to receive the first integrated signal, the second integrated signal and the oscillation signal, and to detect a first variation point at which the second integrated signal becomes greater than the first integrated signal and a second variation point at which the first integrated signal becomes greater than the second integrated signal, generates as the output signal the oscillation signal, with the phase of the oscillation signal being converted to the phase difference corresponding to the first variation point when the second variation point is detected, or as it is if the second variation is not detected.

BRIEF DESCRIPTION OF THE DRAWINGS

The above and other objects, features and advantages of the present invention will become more apparent from the following detailed description when taken in conjunction with the accompanying drawings, in which:

FIG. 8 is a block diagram illustrating a second preferred embodiment of the present invention;

FIG. 9 is a block diagram illustrating a third preferred embodiment of the invention.

DETAILED DESCRIPTION OF THE PREFERRED EMBODIMENTS

Figure 1:
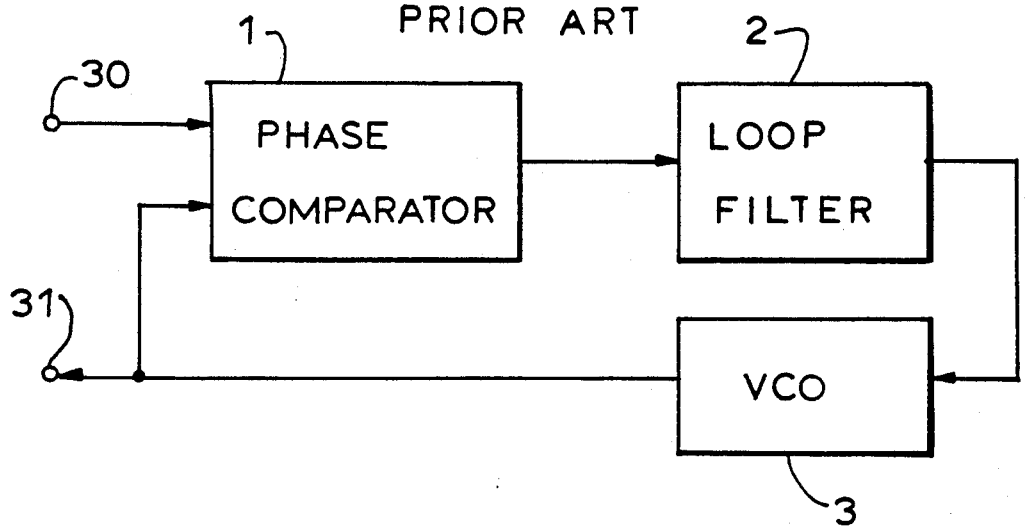
FIG. 1 is a block diagram illustrating an example of P/FLL circuit by the prior art.
Figure 2:
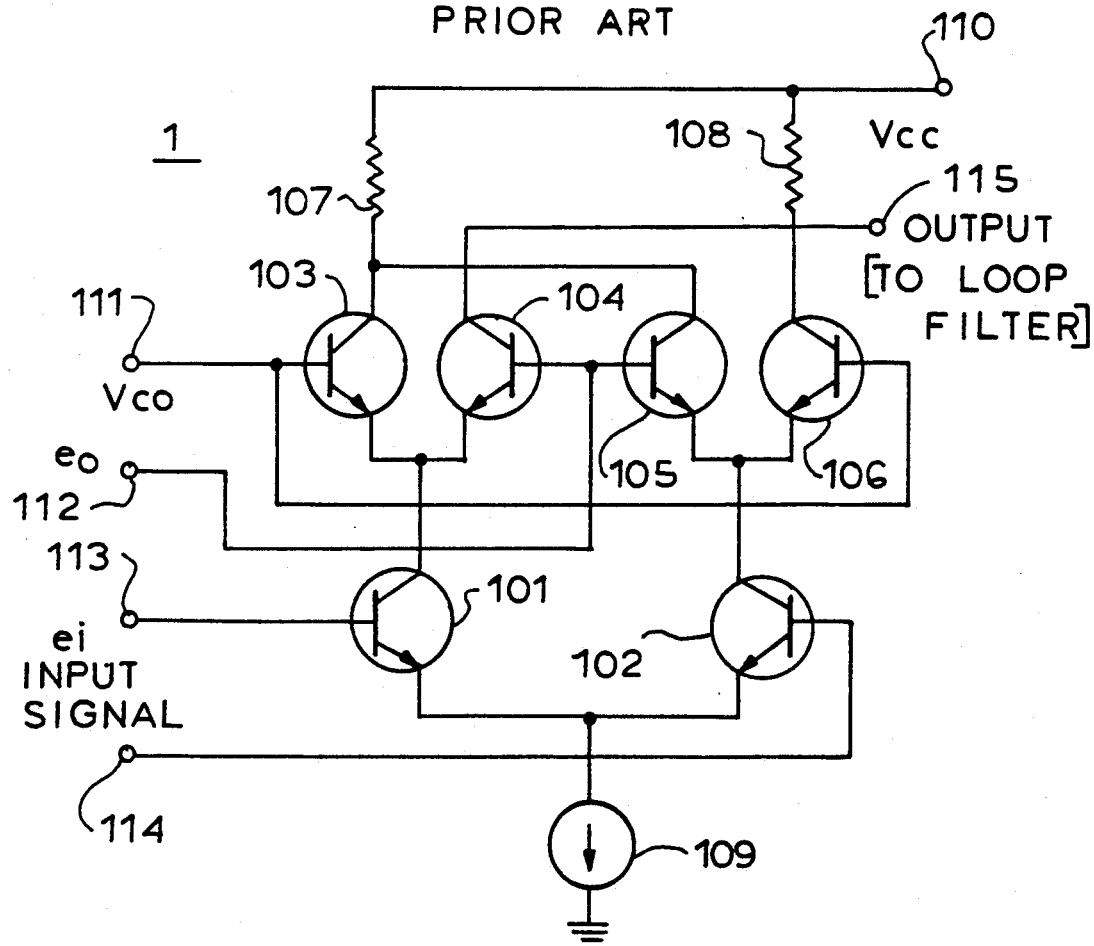
FIG. 2 is a circuit diagram illustrating an example of the phase comparator 1 in FIG. 1.

With a view to facilitating the understanding of the invention, a P/FLL circuit by the prior art will be described first. FIG. 1 is a block diagram illustrating an example of P/FLL circuit by the prior art. The P/FLL circuit shown in FIG. 1 comprises a phase comparator 1, a loop filter 2 and a voltage controlled oscillator (VCO) 3, connected to form a loop. The phase comparator 1 receives input signals, supplied from an input terminal 30, and the output signals of the VCO 3, and generates as phase difference signals voltages corresponding to the phase differences between the input and output signals. The loop filter 2 removes the high frequency noise component from the phase difference signals to output a frequency control signal, and also determines the response characteristics and the synchronization characteristics of the P/FLL circuit according to its amplitude and phase characteristic. The VCO 3 oscillates at a frequency in accordance with the frequency control signal, within a predetermined oscillation frequency range. The oscillation output of the VCO 3 is fed back to the phase comparator 1, and is also supplied as the output signal of the P/FLL circuit. FIG. 2 is a circuit diagram illustrating an example of the phase comparator 1 in FIG. 1. This phase comparator 1 is a four-quadrant multiplier, and has the phase difference-output voltage characteristic of the triangular waveform shown in FIG. 3.

Figure 3:
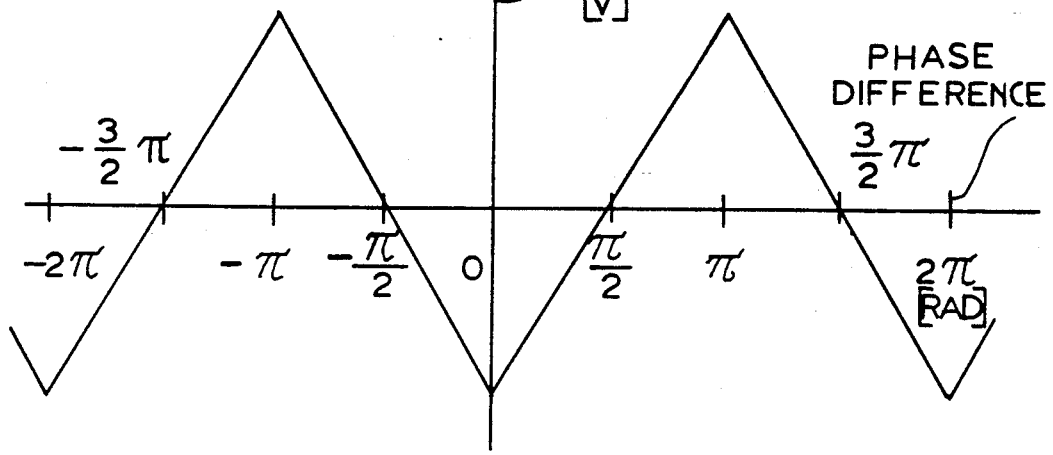
FIG. 3 is a diagram illustrating the output waveform of the phase comparator shown in FIG. 2.

Referring to FIG. 2, the phase comparator 1 comprises first through sixth transistors 101 through 106, a power supply terminal 110, first and second load resistors 107 and 108, and a constant current source 109. Input signals are supplied to the base terminals of the first and second transistors 101 and 102 via first and second input terminals 113 and 114, and control the distribution of the bias currents of the first and second transistors 101 and 102. Meanwhile, the output of the VCO 3 is supplied to the base terminals of the third through sixth transistors 103 through 106 via third and fourth input terminals 111 and 112. As a result, the third and fourth transistors 103 and 104 and the fifth and sixth transistors 105 and 106 operate as single-pole double-throw switches corresponding to the output of the VCO 3 with the further result that the output voltage obtained from an output terminal 115, as shown in FIG. 3, is at its minimum when the phase difference is 0 ($\pm 2\pi$), 0 when it is $\pm\pi/2$ or $\pm 3\pi/2$, and its maximum when it is $\pm\pi$.

Figure 4A:
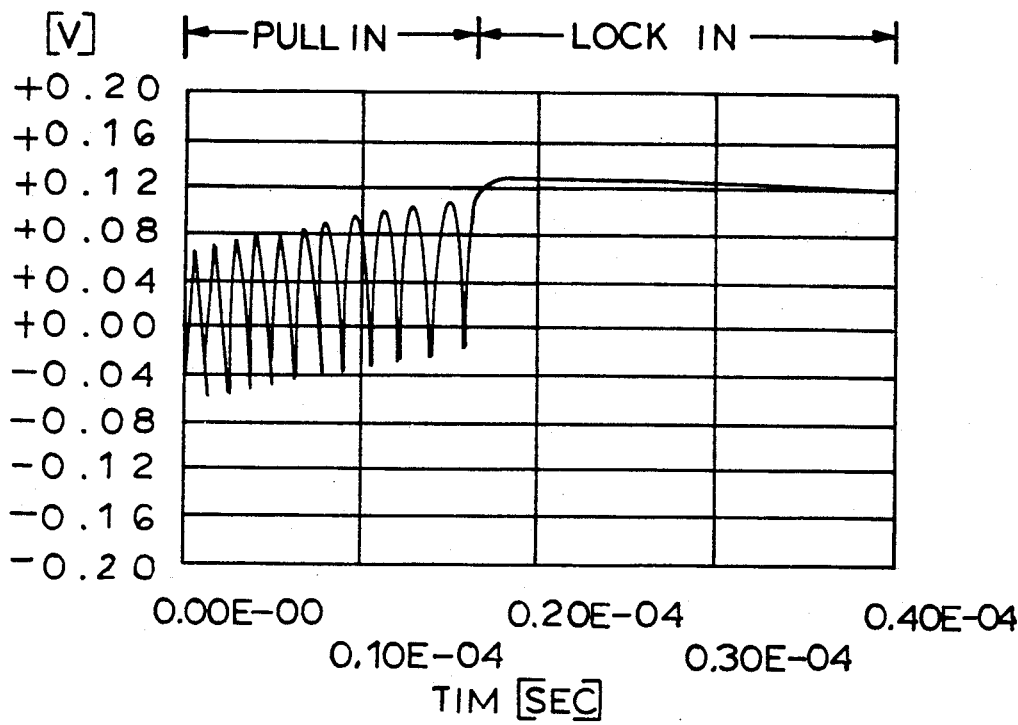
FIGS. 4a and 4b are waveform diagrams for describing the synchronizing operation of the P/FLL circuit shown in FIG. 1.
Figure 4B:
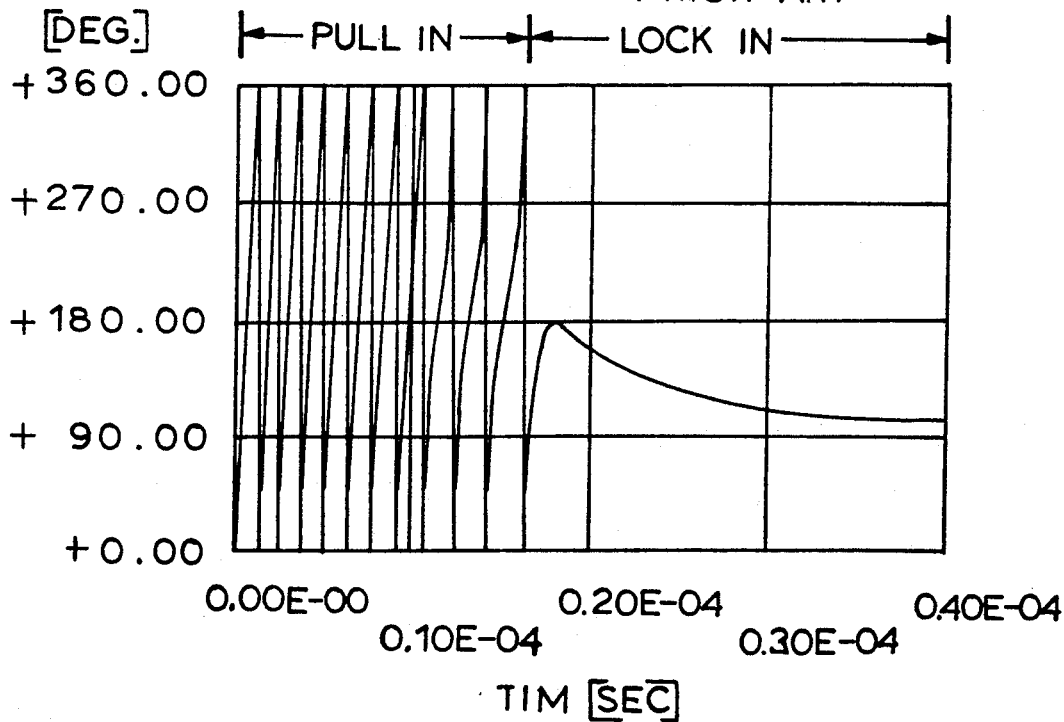

Next will be described the synchronizing operation with reference to FIGS. 4a and 4b. FIG. 4a is a waveform diagram of the output signal supplied by the loop filter 2 when synchronization is effected on input signals having a frequency differing from the free oscillating frequency of the VCO 3, i.e. the frequency control signal. FIG. 4b is a waveform diagram illustrating the phase difference transition between the input signal and the VCO output signal, and corresponds to FIG. 4a. As is evident from FIGS. 4a and 4b, when the frequency of the input signal differs from the oscillating frequency of the VCO 3, the phase difference rotates between 0° and 360° with the result that the phase comparator 1 outputs a beat waveform. In this beat waveform, the positive half-cycle (the period in which a positive voltage is generated) acts so as to bring the oscillation frequency of the VCO closer to, and the negative half-cycle (the period in which a negative voltage is generated), to bring it away from, the frequency of the input signal. As a result, variations arise in the beat waveform, with the time of the positive half-cycle gradually increasing. Along with this waveform variation, the VCO 3 is controlled so as to increase the D.C. level of the beat signal in the positive direction and reduce the frequency difference. As the frequency difference decreases, the D.C. component of the signal increases, resulting in accelerated follow-up of the input signal under a positive feedback effect. This is the frequency pull-in (pull-in) process. When the difference between the input signal frequency and the oscillating frequency of the VCO is reduced beyond a certain extent, the loop of the P/FLL circuit becomes able to fully follow up the beat waveform, and synchronism is established within a single cycle. This is the phase lock-in (lock-in) process. Synchronism is achieved at a phase difference of 90° in FIGS. 4a and 4b because the phase comparator 1 has the output characteristic shown in FIG. 3. As the phase comparator 1, in such a P/FLL circuit by the prior art, alternately outputs positive and negative voltages in the pull-in process where the phase is rotating, the D.C. component of the beat signal to control the VCO 3 is slow to increase, and accordingly a long time is required for synchronism to be established. There further is the problem that, depending on the difference between the input signal frequency and the free oscillating frequency of the VCO 3, the required D.C. component cannot be obtained from the beat signal and therefore synchronism cannot be established.

It is the object of the present invention to solve these problems and realize a P/FLL circuit which is early to establish synchronism and has a wide frequency pull-in range.

Figure 5:
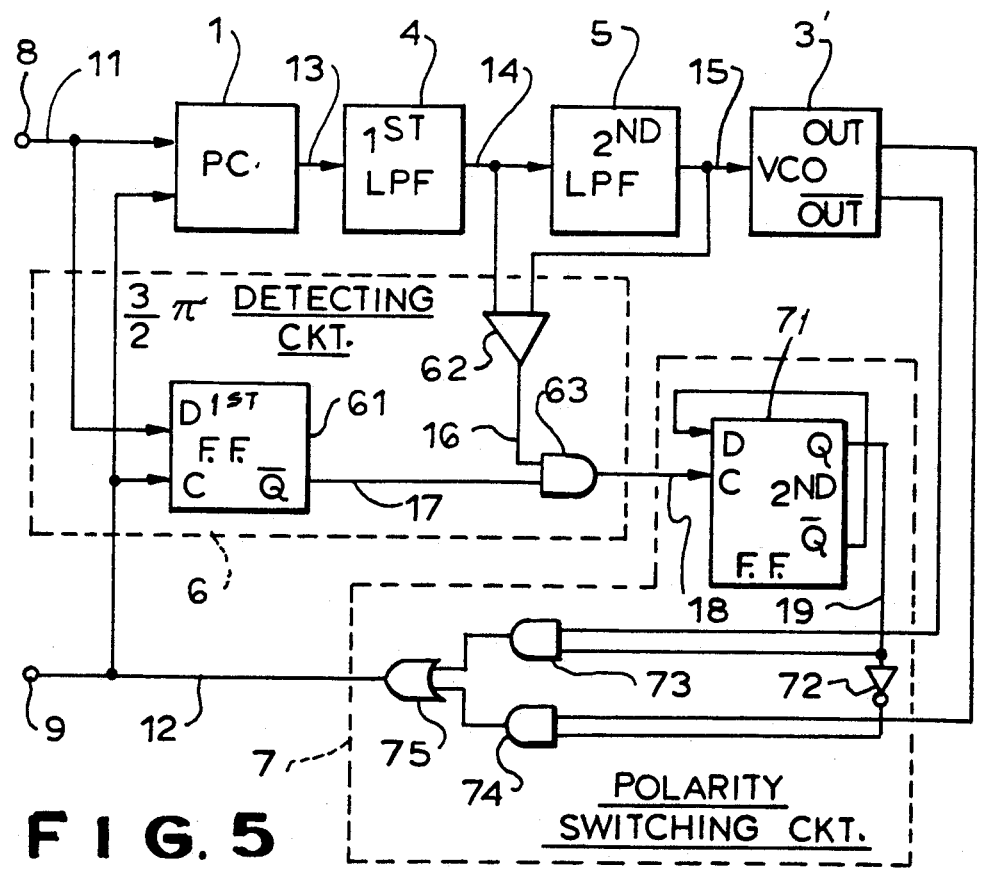
FIG. 5 is a block diagram illustrating a first preferred embodiment of the present invention.

FIG. 5 is a block diagram illustrating a first preferred embodiment of the present invention. The P/FLL circuit shown in FIG. 5 consists of a phase comparator (PC) 1, first and second low-pass filters (LPF's) 4 and 5, a VCO 3', a polarity switching circuit 7 and a $3\pi/2$ detecting circuit 6. The comparator 1 outputs as a phase difference signal a voltage corresponding to the phase difference between the output signal of the polarity switching circuit 7 (circuit output signal) and an input signal supplied from an input terminal 8. The LPF's 4 and 5, constituting what corresponds to the loop filter in FIG. 1, remove the harmonic noise component from the phase difference signal, which is then outputted as a frequency control signal, and also determines the circuit characteristic. The VCO 3' generates oscillation signals having a frequency corresponding to the frequency control signal. The VCO 3' internally has signal inverting means, such as an inverter, and generates two oscillation signals, one of which is inverted in phase. The polarity switching circuit 7 selects one of the two oscillation outputs generated by the VCO 3' according to a $3\pi/2$ detection signal generated by the $3\pi/2$ detecting circuit 6, and supplies it as the circuit output signal, which is supplied via an output terminal 9 and also fed to the $3\pi/2$ detecting circuit 6. The $3\pi/2$ detecting circuit 6 receives the input signal, the circuit output signal and the output signals of the LPF's 4 and 5 and, when the phase difference between the input signal and the circuit output signal reaches $3\pi/2$, generates the detection signal. The $3\pi/2$ detecting circuit 6, as shown in FIG. 5, consists of a first flip-flop (FF) 61, a level comparator 62 and a first AND gate 63. The first FF 61, receiving the circuit output signal at its clock terminal and the input signal at its data terminal, supplies a negative-phase output as a selection signal. The level comparator 62 receives the output signals of the LPF's 4 and 5, and outputs a comparison signal, which is at a high level when the output of the LPF 4 is greater than that of the LPF 5 and at a low level when vice versa. The AND gate 63 receives the selection signal and the comparison signal and generates their logical product as a detection signal. The polarity switching circuit 7 consists of a second FF 71, an inverter 72, second and third AND gates 73 and 74, and an OR gate 75. The FF 71, receiving the detection signal generated by the $3\pi/2$ detecting circuit 6 at its clock terminal, generates a positive-phase output as a polarity switching signal. Its data terminal is short-circuited with a negative-phase output terminal. The inverter 72 inverts the polarity switching signal, which is then outputted as an inverted polarity switching signal. The AND gate 73, receiving the positive-phase oscillation output of the VCO 3' and the polarity switching signal, outputs their logical product as a first selected phase signal. Similarly, the AND gate 74, receives the negative-phase oscillation output of the VCO 3' and the inverted polarity switching signal, and supplies their logical product as a second selected phase signal. The OR gat 75, receiving the first and second selected phase signals, calculates their logical sum and supplies it as the circuit output signal.

Next will be described the principle of the present invention. As stated above, the phase difference rotates in the pull-in process, and therefore the phase comparison signal outputted by the phase comparator takes on a beat waveform in which positive and negative half-cycles repeatedly alternate between each other. In the beat waveform, the positive half-cycle has the effect to reduce, and the negative half-cycle, conversely, to increase the frequency difference. In P/FLL citcuits by the prior art, the average D.C. component of this beat waveform was used to control the VCO. As negative half-cycles in the phase comparison signal reduce, however, the D.C. component required for VCO control, the pull-in process was elongated, resulting in a longer time required for the establishment of synchronism. Moreover, in some cases it is impossible, depending on the frequency of input signals, to obtain the required D.C. component from the phase comparison system and to establish synchronism at all even within the range of frequency control. In view of this problem, according to the present invention, control is so effected as to switch two VCO outputs, having a 180° phase difference between each other, back and forth so that the phase comparator can always generate a phase comparison signal of a positive voltage. Suppose that the comparator 1 in the P/FLL circuit of FIG. 5 has the characteristic shown in FIG. 3. Whereas the phase difference rotates between 0 and $2\pi$ in the pull-in process, it is in the phase difference range of $\pi/2$ to $3\pi/2$ that the comparator 1 generates a positive voltage. Therefore, if the output phase of the VCO 3' is shifted by $\pi(180°)$ when the phase difference is $3\pi/2$, i.e. if the polarity of the output of the VCO 3' is inverted and fed back to the comparator 1, the phase difference will jump from $3\pi/2$ to $\pi/2$, and the phase comparison signal can always have a positive voltage. Since the negative half-cycles in the pull-in process are eliminated as a result, the time taken by the pull-in process can be correspondingly reduced.

Figure 6A:
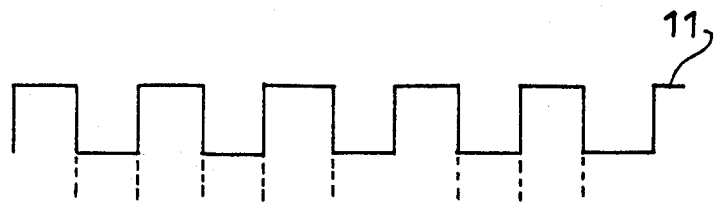
FIGS. 6a through 6h illustrate waveforms in different parts of FIG. 5.
Figure 6B:
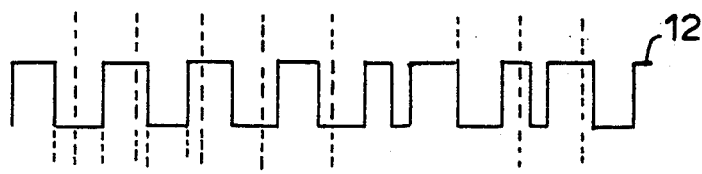
Figure 6C:
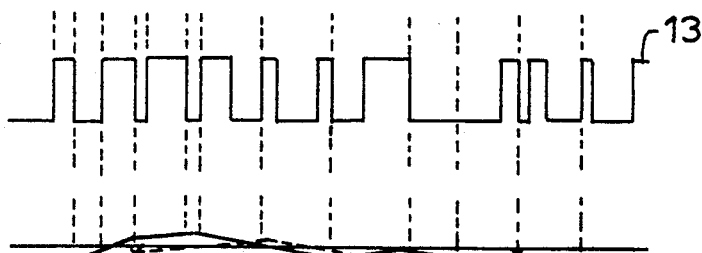
Figure 6D:
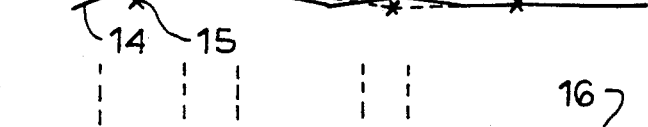
Figure 6E:
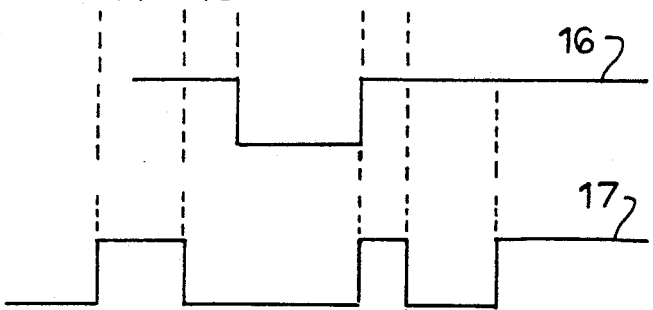
Figure 6F:
Figure 6G:
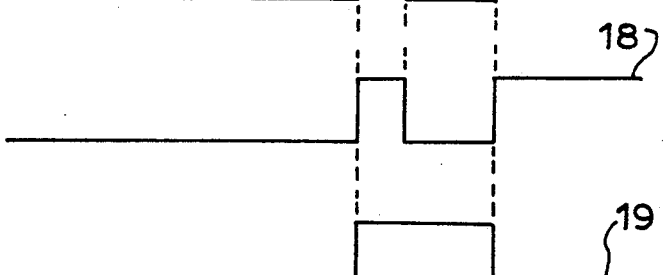
Figure 6H:
Figure 7A:
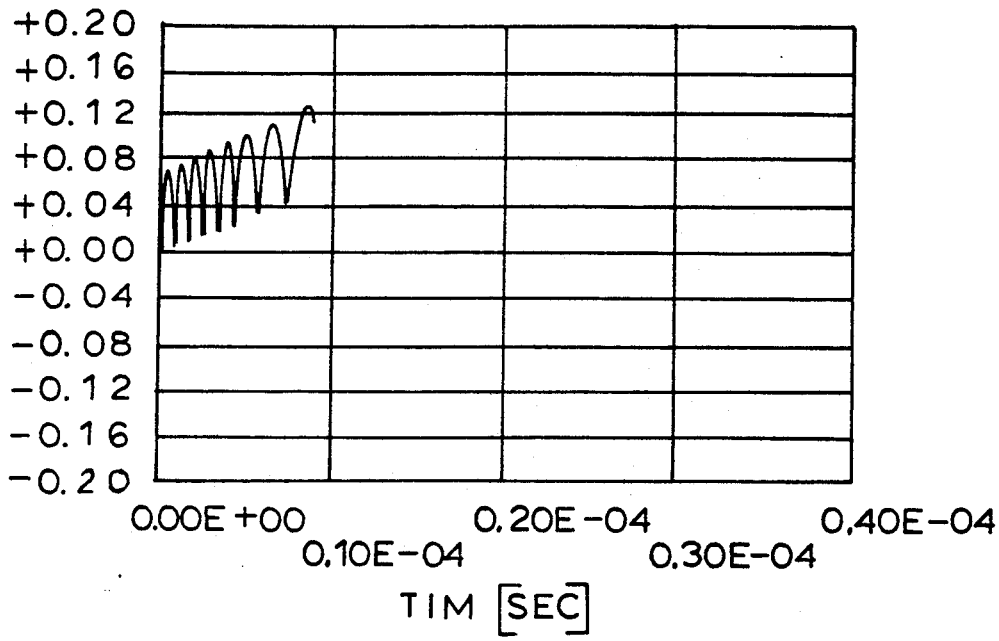
FIGS. 7a and 7b are waveform diagrams for describing the synchronizing operation of the P/FLL circuit shown in FIG. 5.
Figure 7B:
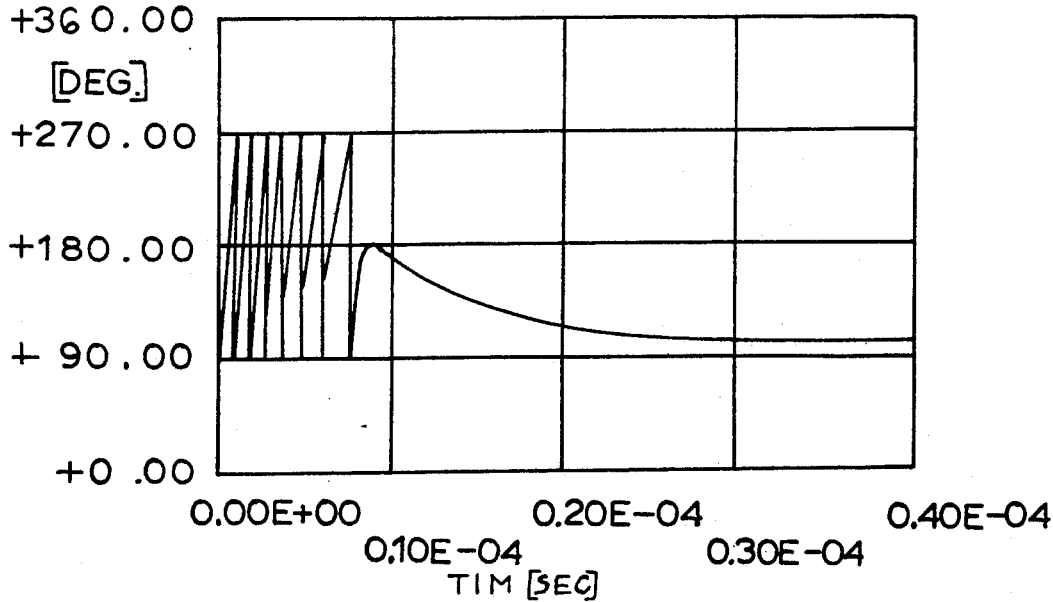

The operation will be described next with reference to FIGS. 6a through 6h, illustrating a case, by way of example, in which the frequency of the input signal is lower than the free oscillating frequency of the VCO 3'. The comparator 1 used here is a digital phase comparator having the characteristic shown in FIG. 3, for instance an EXOR gate. Regarding the time constants (t1 and t2, respectively) of the LPF's 4 and 5, t1 is supposed to be equal to a half cycle, and t2, to a full cycle of the input signal. The comparator 1 receives an input signal 11 (FIG. 6a) and a circuit output signal 12 (FIG. 6b), and supplies a phase difference signal 13 (FIG. 6c). The LPF 4 integrates the phase difference signal 13 for a time constant (t1) section, and outputs the result as an integrated signal 14 (FIG. 6d, represented by a solid line). The LPF 5 further integrates the integrated signal 14 for another time constant (t2) section, and outputs the result as a frequency control signal 15 (FIG. 6d, represented by a broken line). The VCO 3' oscillates in accordance with this frequency control signal 15. The level relationship between the integrated signal 14 and the frequency control signal 15 is detected by the level comparator 62, which generates a comparison signal 16 (FIG. 6e) at a high level when the level of the integrated signal is higher than that of the frequency control signal 15, or at a low level when vice versa. As the comparator 1 has the characteristic shown in FIG. 3, there is no change in the relationship that both the integrated signal, resulting from the integration of the phase comparison signal 13 and the frequency control signal 15 resulting from the further integration of the integrated signal 14 are at the minimum when the phase difference is 0, at the maximum when it is $\pi$ and 0 when it is $\pi/2$ or $3\pi/2$, but the absolute values of the minimum and of the maximum are greater for the frequency control signal 15. Therefore, the points at which the level relationship between the integrated signal 14 and the frequency control signal 15 is reversed correspond to the phase differences of $\pi/2$ and $3\pi/2$. Meanwhile, as the input signal 11 is at its low level at the leading edge of the circuit output signal 12 when the phase difference is between $\pi$ and $2\pi$, the level varying point of the comparison signal 16 satisfying this condition corresponds to the phase difference of $3\pi/2$. If the inverted value of the input signal 11 at the leading edge of the circuit output signal 12 is generated as a selection signal (FIG. 6f) with the first FF 61, and its logical product with the comparison signal 16 (FIG. 6e) is calculated with the AND gate 63, there will be obtained a detection signal 18 (FIG. 6g) whose leading edge corresponds to a phase difference of $3\pi/2$. The polarity-switching signal (FIG. 6h) has a level which is inverted at the leading edge of every detection signal 18. The polarity switching signal 19 is fed as it is to the AND gate 73, and its inverted version, the inversion being effected by the inverter 72, is supplied to the AND gate 74. Since a negative-phase output and a positive-phase output are respectively supplied to the AND gates 73 and 74, either the positive-phase or the negative-phase output of the VCO 3' is fed back as the circuit output signal 12 (FIG. 6b) to the comparator 1 via the OR gate 75. In this way, the output of the comparator 1 is always maintained in the positive region. FIGS. 7a and 7b are waveform diagrams illustrating the synchronizing operation by the preferred embodiment of the present invention, and correspond to FIG. 4a and 4b, respectively. As shown in FIG. 7b, the phase rotation range in the pull-in process is limited between $\pi/2$ and $3\pi/2$, and the comparator 1 always generates a phase comparison signal having a positive voltage (FIG. 7a). As a result, the D.C. component required for controlling the VCO 3' quickly increases, the pull-in process is shortened, and the establishment of synchronism advanced. Furthermore, as the apparent loop gain of the P/FLL circuit increases, the pull-in range (the frequency difference range in which frequency pull-in is possible) is expanded, and synchronism can be achieved without fail if within the oscillating frequency range of the VCO 3'.

FIG. 8 is a block diagram illustrating a second preferred embodiment of the present invention. It differs from the first embodiment shown in FIG. 5 in that here a VCO 3 with only a positive-phase output is used and a switch 77 replaces the AND gates 73 and 74 and the OR gate 75 in the embodiment of FIG. 5. Thus a polarity switching circuit 7' consists of an FF 78, an inverter 76 and the selector switch 77. The FF 78, identical with the second FF 71, generates a polarity switching signal from its positive-phase output terminal. The positive-phase oscillation output of the VCO 3 is fed as it is to one of the input ends of the switch 77 as a positive-phase signal, and inverted by the inverter 76 into a negative-phase signal, which is fed to the other input end of the switch 77. The switch 77 alternately selects a positive-phase signal and a negative-phase signal at the leading edge of every polarity switching signal, and feeds back the selected signal to the comparator 1 as the circuit output signal. The description of all other actions is dispensed with here because they are the same as in the embodiment of FIG. 5. In these two preferred embodiments, the time constants of the LPF's may be in any relationship to each other unless their total changes.

FIG. 9 is a block diagram illustrating a third preferred embodiment of the present invention. The difference of this embodiment is in the method to detect the phase difference of $3\pi/2$. More specifically, two each of phase comparators and loop filters are provided, and there are used signals having the same frequency as and a $\pi/2$ phase difference from the input signal, generated by a VCO having an oscillating frequency double the frequency of the input signal and frequency dividers. Referring to FIG. 9, the oscillating frequency of a VCO 207 is preset to be about double the frequency of the input signal. The oscillation signal generated by the VCO 207 is fed directly to a first frequency divider (FD) 208 and via a first inverter 210 to a second FD 209. The inverter 210 inverts the oscillation signal, and the inverted oscillation signal is supplied to the FD 209. As the oscillation frequency of the VCO 207 is double the frequency of the input signal, the inverted oscillation signal has a phase difference of $\pi/2$ from the input signal. the FF's 208 and 209 divide the respective frequencies of the oscillation signal and the inverted oscillation signal, and output the results as first and second frequency-divided signals. As a result, the first and second frequency-divided signals have the same frequency as the input signal. Out of two input terminals a and b of a first switch 215, the terminal a is supplied with the first frequency-divided signal as it is, and the terminal b, with the first frequency-divided signal inverted in phase by a second inverter 213. The second frequency-divided signal is similarly supplied to a second switch 216. The switches 215 and 216 alternately select the input terminals a and b in accordance with the polarity switching signal, which is the positive-phase output of an FF 212, and output the results of selection as first and second selection signals. The first selection signal is outputted externally as the circuit output signal via an output terminal 217, and also fed back to a first phase comparator 201. Meanwhile, the second selection signal is fed back to a second phase comparator 202. The comparators 201 and 202 generate phase comparison signals corresponding to the phase differences of the first and second selection signals, respectively, from input signals supplied via an input terminal 200. The comparators 201 and 202, like the corresponding ones in the first and second embodiments for instance, are supposed to have the output characteristic shown in FIG. 3. The first and second phase comparison signals are supplied to first and second loop filters 203 and 204, which, like the loop filter 2 shown in FIG. 1, removes harmonic noise from the first and second phase comparison signals, and output the results as first and second filtered signals. The first filtered signal is fed to a VCO 207 as a frequency control signal, and also supplied to a first level comparator 205. The second filtered signal is supplied to a second level comparator 206. The level comparator 205 generates a first comparison signal of a high level if the voltage of the first filtered signal is positive or of a low level if it is negative. The level comparator 206 similarly generates a second comparison signal for the second filtered signal. A NAND gate 211 calculates the non-conjunction of the first and second comparison signals, and outputs the result as a phase difference detection signal. As will be stated below, the leading edge of the phase difference detection signal corresponds to the point at which the phase difference between the input signal and the circuit output signal is $3\pi/2$. The phase difference signal is supplied to the clock terminal of the FF 212. The positive-phase output level of the FF 212, with its negative-phase output terminal and data terminal short-circuited, is inverted at the leading edge of every phase detection signal. The positive-phase output of the FF 212 is used as the polarity switching signal for controlling the switching of the switches 215 and 216. As a result, the phase of the circuit output signal can be enabled to jump by 180° every time the phase difference of $3\pi/2$ is detected, so that there is achieved the same effect as that by the first and second preferred embodiments.

Figure 10A:
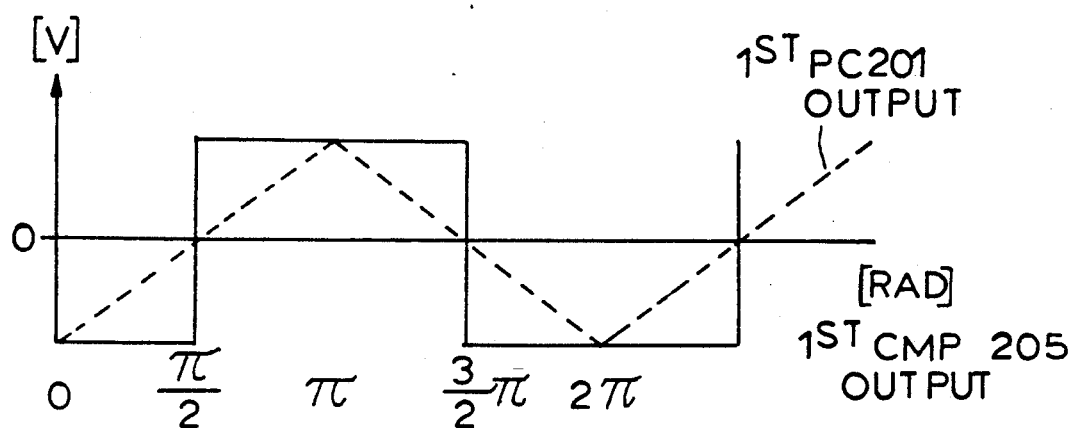
FIGS. 10a through 10c illustrate waveforms in different parts of FIG. 9.
Figure 10B:
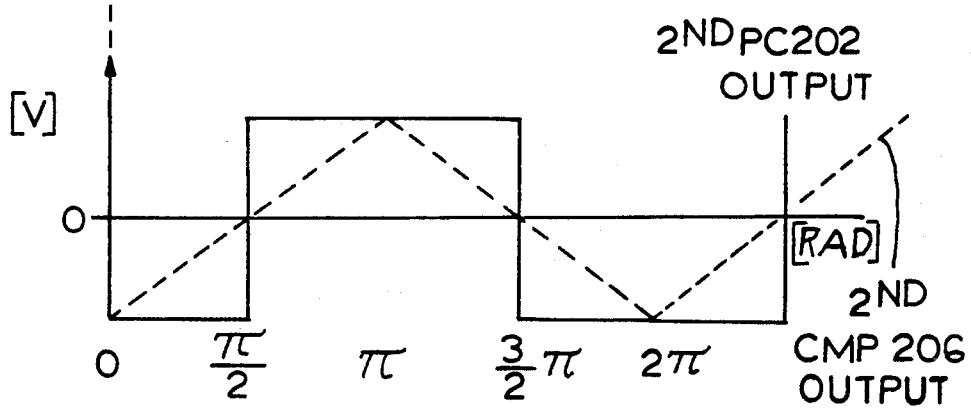
Figure 10C:
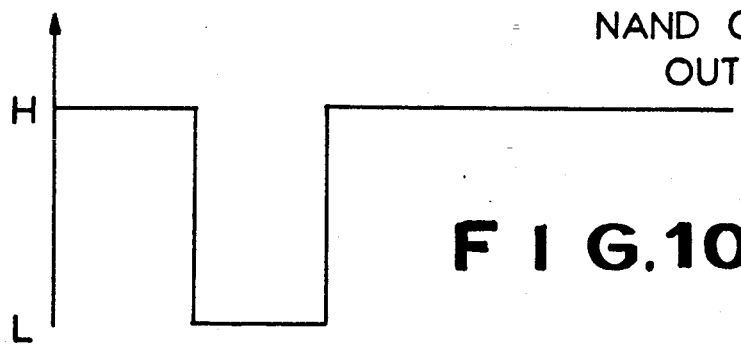

Next will be described in further detail, with reference to FIGS. 10a through 10c, the method to detect the $3\pi/2$ phase difference in this preferred embodiment. FIGS. 10a and 10b respectively illustrate the relationship between the first phase comparison signal and the comparison signal and that between the second phase comparison signal and the comparison signal. Although the comparators 201 and 202 and the level comparators 205 and 206 have respectively the same configurations, the second selection signal, because of its $\pi/2$ phase difference from the input signal, is supplied to the NAND gate 211 in the relationships shown in FIGS. 10a and 10b. The point at which the first comparison signal varies from its high to low level in the section where the second comparison signal is at its high level corresponds to the phase difference of $3\pi/2$. Therefore, the leading edge of the polarity switching signal outputted by the NAND gate 211 corresponds to the $3\pi/2$ phase difference.

As hitherto described, the present invention provides the benefit that the time required for the establishment of synchronism can be reduced and the pull-in range expanded by detecting the phase difference at which the output voltage of the phase comparator varies from positive and negative and enabling the phase of the output signal of the VCO to jump by the phase difference at which the output voltage of the phase comparator varies from negative to positive. Although the phase difference of $3\pi/2$ is detected in the first through third preferred embodiments because a phase comparator or comparators having the characteristic shown in FIG. 3 are used therein, it is evident to those skilled in the art that the invention can be adapted to other cases where a phase comparator or comparators having a different characteristic are used. Further, while the description refers to cases in which the phase comparator's or comparators' output has a triangular waveform characteristic, a phase comparator or comparators whose output has a sine waveform characteristic may as well be used.

What is claimed is:

1. A phase/frequency-locked loop (P/FLL) circuit for generating output signals synchronized with input signals in frequency and phase, comprising:

phase comparator means responsive to said input signals and said output signals for outputting positive or negative voltages corresponding to the phase difference between them as phase comparison signals;

first integrating means for calculating the integrated value of said phase comparison signals in each first prescribed time and outputting it as a first integrated signal;

second integrating means for calculating the integrated value of said phase comparison signals in each second prescribed time and outputting it as a second integrated signal;

voltage controlled oscillator means responsive to said second integrated signal for outputting an oscillation signal having a frequency corresponding to said second integrated signal; and phase controller means which, having comparator means to receive said first integrated signal, said second integrated signal and said oscillation signal, and to detect a first variation point at which said second integrated signal becomes greater than said first integrated signal and a second variation point at which said first integrated signal becomes greater than said second integrated signal, generates as said output signal said oscillation signal, with the phase of said oscillation signal being converted to produce a phase difference corresponding to said first variation point when said second variation point is detected, and with the phase of said oscillation signal being kept as it is if said second variation point is not detected.

2. A phase and frequency-locked loop (P/LL) circuit for generating output signals synchronized with input signals in frequency and phase, comprising:

a phase comparator means responsive to said input signals and said output signals for outputting phase comparison signals having positive or negative voltages corresponding to the phase difference between said input signals and said output signals;

VCO control means responsive to said phase comparison signals and effective to develop a VCO control voltage;

a voltage controlled oscillator responsive to said VCO control voltage for outputting an oscillation signal having a frequency which is dependent on said VCO control voltage; and phase comparator control means responsive to said voltage controlled oscillator and said VCO control means and effective for producing said output signals in a form which is effective to cause said VCO control voltage to have a substantially single voltage polarity.

3. The circuit of claim 2, wherein said VCO control means comprises first and second integration circuits.

4. The circuit of claim 3, wherein said first and second integration circuits comprise, respectively, first and second low pass filters.

5. The circuit of claim 2, wherein said voltage controlled oscillator is effective to output said oscillation signal as a pair of oscillation signals separated in phase by about 180°.

6. The circuit of claim 5, wherein said phase comparator control means is effective for selecting and applying to said phase comparator means one or the other of said pair of oscillation signals of said voltage controlled oscillator.

7. The circuit of claim 2, wherein said phase comparator control means is effective to cause said phase comparator means to output said phase comparison signals in a form indicating a phase difference range that is substantially less than 360°.

8. The circuit of claim 7, wherein said phase difference range extends from about 90° to 270°.

9. The circuit of claim 2, wherein said phase comparator control means includes a switching circuit for switching the polarity of the oscillation signal received from said voltage controlled oscillator.

10. The circuit of claim 2, wherein said phase comparator control means is effective for detecting transitions of said phase comparison signals through at least one pre-determined phase angle.

11. The circuit of claim 2, wherein said voltage controlled oscillator is effective to output said oscillation signal in a form having only a positive-phase.

12. The circuit of claim 11, wherein said phase comparator control means is effective to selectively reverse the polarity of said oscillation signal.

13. The circuit of claim 2, said phase comparator means comprising first and second phase comparators, said VCO control means comprising first and second loop filters, said voltage controlled oscillator being effective to produce first and second oscillation signals have the same frequency and being 90° out of phase with said input signals, said oscillation signals having a frequency about double that of said input signals.

14. The circuit of claim 13, further comprising first and second frequency dividers coupled respectively to said first and second oscillation signals.

15. The circuit of claim 14, further comprising first and second level comparators, said first level comparator being coupled to said first loop filter and said second level comparator being coupled to said second loop filter.

16. The circuit of claim 2, wherein said phase comparator control means is effective to reduce the pull-in range of said circuit.

* * * * *